(12) United States Patent
Han et al.

(10) Patent No.: US 9,276,620 B2
(45) Date of Patent: Mar. 1, 2016

(54) SECOND-ORDER INPUT INTERCEPT POINT (IIP2) CALIBRATION METHOD OF A MIXER IN A WIRELESS COMMUNICATION SYSTEM AND THE MIXER USING THE SAME

(71) Applicant: Samsung Electronics Co., Ltd., Suwon-si, Gyeonggi-do (KR)

(72) Inventors: Jung-Hwan Han, Seoul (KR); Kuduck Kwon, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 14/063,346

(22) Filed: Oct. 25, 2013

(65) Prior Publication Data

US 2014/0226759 A1 Aug. 14, 2014

(30) Foreign Application Priority Data

Feb. 8, 2013 (KR) ........................ 10-2013-0014621

(51) Int. Cl.
*H04B 1/26* (2006.01)
*H04B 1/12* (2006.01)

(52) U.S. Cl.
CPC ........................................ *H04B 1/12* (2013.01)

(58) Field of Classification Search
CPC .......................................................... H04B 1/12
USPC .......... 455/196.1, 232.1, 226.1, 313, 318, 333
See application file for complete search history.

(56) References Cited

U.S. PATENT DOCUMENTS 8,010,074 B2 * 8/2011 Kaczman et al. ............. 455/313
2009/0186587 A1 * 7/2009 Sobchak et al. ........... 455/196.1

* cited by examiner

*Primary Examiner* — Sanh Phu
(74) *Attorney, Agent, or Firm* — Jefferson IP Law, LLP

(57) ABSTRACT

A mixer included in a receiver of a wireless communication system is provided. The mixer includes a switching unit including a plurality of transistors receiving a Radio Frequency (RF) signal and a Local Oscillation (LO) signal, and outputting a baseband signal, and a voltage controller outputting a voltage control signal controlling a body voltage of at least one transistor from among the plurality of transistors to thereby control a threshold voltage of the at least one transistor.

20 Claims, 3 Drawing Sheets

SECOND-ORDER INPUT INTERCEPT POINT (IIP2) CALIBRATION METHOD OF A MIXER IN A WIRELESS COMMUNICATION SYSTEM AND THE MIXER USING THE SAME

PRIORITY

This application claims the benefit under 35 U.S.C. §119 (a) of a Korean patent application filed in the Korean Intellectual Property Office on Feb. 8, 2013 and assigned Serial No. 10-2013-0014621, the entire disclosure of which is incorporated herein by reference.

BACKGROUND OF THE INVENTION

1. Field of the Invention

The present invention relates generally to a second-order Input Intercept Point (IIP2) calibration method of a mixer in a receiver of a wireless communication system and the mixer using the same.

2. Description of the Related Art

A down-converter for down-converting Radio Frequency (RF) signals in a receiver of a wireless communication system includes a mixer, a local oscillator, and other similar components for down-converting RF signals, and the mixer on/off controls a switch to perform frequency down-conversion.

FIG. 1 is a block diagram illustrating a configuration of a receiver including a general mixer in a wireless communication system according to the related art.

Referring to FIG. 1, a receiver 100 includes a transmission (TX) chain 110 for performing frequency up-conversion, filtering, and other similar operations on transmission signals, a power amplifier 120 for amplifying the power of the transmission signals, an antenna 130, a duplexer 140, and a reception (RX) chain 150 for performing frequency down-conversion, filtering, and other similar operations on reception signals.

The RX chain 150 includes a Low Noise Amplifier (LNA) 151 for amplifying the reception signals, a mixer 153 for performing frequency synthesis of an RF signal and a Local Oscillation (LO) signal for frequency down-conversion, a Local Oscillator (LO) 155 for generating the LO signal, and a LO buffer 157 for buffering the LO signal. The mixer 153 performs frequency down-conversion by synthesizing an RF signal of a high frequency band received through the antenna 130 with the LO signal to output a baseband signal of a low frequency band.

The gain, noise, linearity, power consumption, and other similar characteristics of the mixer 153 are important factors for determining a performance of the mixer 153. In the case of a Frequency Division Duplex (FDD) system in which a TX chain and a RX chain operate together, for example, in an FDD system of a wireless communication system, such as a High Speed Packet Access (HSPA) system and a Long Term Evolution (LTE) system, the influence of Inter-Modulation (IM) due to transmission (TX) leakage, such as TX leakage of a TX jammer flowing from the TX chain to the RX chain through a duplexer, is also considered as one of important factors for determining the performance of a mixer.

In order to remove TX leakage, such as that from the TX jammer, in the receiver 100 illustrated in FIG. 1, a Surface Acoustic Wave (SAW) filter 160 is provided between the LNA 151 and the mixer 153. However, it is not preferable that the receiver 100 includes an additional device such as the SAW filter 160. Accordingly, a receiver having a passive switching mixer, instead of a SAW filter, may be used since the passive switching mixer has relatively lower power consumption than an active switching mixer, such as a Gilbert cell mixer, and has high linearity in view of third-order nonlinearity. Also, the passive switching mixer is less influenced by flicker noise since no Direct Current (DC) flows through the passive switching mixer. However, since the second-order nonlinearity or second-order Input Intercept Point (IIP2) of the passive switching mixer are decided by mismatch factors of a frequency down-converter in a receiver, like the active switching mixer, there is still reception sensitivity deterioration due to the TX jammer.

The IIP2 is a factor indicating the linearity of a circuit. Interference between channels having a small frequency difference or interfering signals in signal bands may distort a reception signal, and IIP2 is defined to indicate the linearity of a circuit through a relationship between the amplified amount of an input frequency and the amount of distortion due to second-order Inter-Modulation (IM2) among factors causing signal distortion. In more detail, if the power of a signal received by a receiver continues to increase, then the power of an IM2 distortion signal may also sharply increase. IIP2 is an amount of power at which the reception signal is expected to intersect the IM2 distortion signal, as seen from an input terminal of the receiver. Accordingly, in order to ensure high linearity in a wireless communication system, the IIP2 should be high, which leads to minimization of IM2 distortion. Thus, in a wireless communication system, a receiver should be designed such that a parameter representing IIP2 has a great value.

Also, in a mixer, causes of IM2 being a factor for determining IIP2 may be largely classified into three components, namely a component corresponding to a size of a mixer configured with transistors or a mismatch in a threshold Voltage ($V_{TH}$) according to the size of the mixer, a component corresponding to coupling of different leakage signals between an RF input and an LO input, and a component corresponding to a path of a LO signal or a mismatch of LO AC-coupling. Accordingly, in order to optimize IIP2 and/or in order to improve layout symmetry and matching, a mixer may have a large size. Also, in order to make IIP2 stable against changes in Process-Voltage-Temperature (PVT) properties without using a SAW filter, studies into various IIP2 calibration methods are conducted.

As an example of related-art IIP2 calibration methods, there is a method of unequally adjusting the output symbols of a mixer to optimize IIP2. However, the method is mainly applied to a Gilbert-type active mixer having mixer load, and switches used in tunable mixer load may increase flicker noise of the mixer or deteriorate the linearity of the mixer, resulting in IQ imbalance. As another example, there is a method of performing unbalanced DC or DC offset injection on a baseband signal path to cancel the mismatch of a mixer. However, this method may produce an additional DC offset in a baseband filter terminal.

As another IIP2 calibration method, there is a method of finely adjusting a gate bias of a switch in a mixer to calibrate a threshold voltage or a size mismatch of the mixer. This method may reduce flicker noise or a DC offset, however, this method needs an accurate resolution setting for a Digital Analog Converter (DAC) used to control the mixer since IIP2 is sensitive to the gate voltage of the switch of the mixer. Also, due to an increase in a number of bits of control signals for controlling the mixer, the configuration of the DAC is complicated so that delay is generated upon calibration of IIP2.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a method of efficiently calibrating a second-order Input Intercept Point (IIP2) of a mixer that is used in a wireless communication system, and the mixer using the same.

In accordance with an aspect of the present invention, a mixer included in a receiver of a wireless communication system is provided. The mixer includes a switching unit including a plurality of transistors receiving a Radio Frequency (RF) signal and a Local Oscillation (LO) signal, and outputting a baseband signal, and a voltage controller outputting a voltage control signal controlling a body voltage of at least one transistor from among the plurality of transistors to thereby control a threshold voltage of the at least one transistor.

In accordance with another aspect of the present invention, a receiver of a wireless communication system is provided. The receiver includes a mixer for frequency synthesis, and a controller outputting a switching control signal for calibrating a IIP2 of the mixer, wherein the mixer includes a switching unit including a plurality of transistors receiving a RF signal and a LO signal, and outputting a baseband signal, and a voltage controller outputting a voltage control signal controlling a body voltage of at least one transistor from among the plurality of transistors according to the switching control signal to thereby control a threshold voltage of the at least one transistor.

In accordance with still another aspect of the present invention, an IIP2 calibration method of a mixer including a plurality of transistors in a wireless communication system is provided. The method includes determining whether a parameter value indicating the IIP2 is smaller than a predetermined threshold value, generating a switching control signal controlling a body voltage of at least one transistor from among the plurality of transistors if the parameter value is smaller than the predetermined threshold value, and outputting a voltage control signal that is applied to the body of the at least one transistor according to the switching control signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A second-order Input Intercept Point (IIP2) performance of a mixer included in a receiver of a wireless communication system may influence a sensitivity and a linearity of the receiver. Accordingly, a high IIP2 of 55-60 dBm or more may be needed. However, in order to compensate for second-order Inter-Modulation (IM2) distortion caused by various mismatch factors, or in other words, in order to calibrate IIP2, a separate IIP2 calibration circuit and a large number of bits for a control signal of the mixer are needed, which leads to an increase in complexity of the mixer and time delay upon IIP2 calibration. Accordingly, an IIP2 calibration method of a mixer and the mixer using the same, capable of minimizing the performance deterioration of a receiver while reducing a time required for IIP2 calibration, according to embodiments of the present invention, will be described below.

For this, according to exemplary embodiments, a mixer structure for efficiently calibrating IIP2 using a body effect of a transistor, such as a Metal Oxide Semiconductor Field-Effect Transistor (MOSFET), and an IIP2 calibration method of the mixer structure are proposed. The body effect may be a phenomenon wherein a threshold voltage of a transistor, such as a MOSFET, rises due to a reverse voltage between the body and a source of the transistor. If a voltage, hereinafter, referred to as a body voltage, applied to the body of the transistor changes, then the threshold voltage of the transistor changes so that IIP2 may be calibrated by a mismatch caused by the changed threshold voltage.

Figure 1:
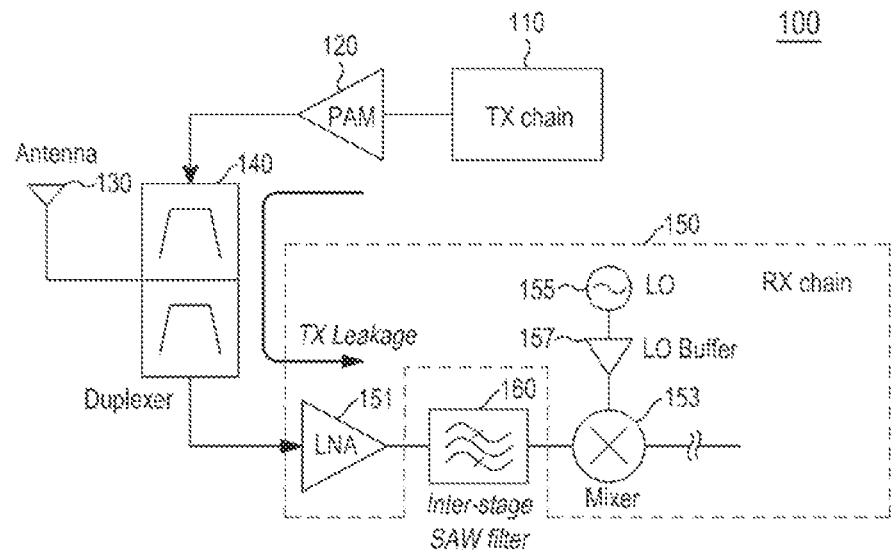
FIG. 1 is a block diagram illustrating a configuration of a receiver including a general mixer in a wireless communication system according to the related art.
Figure 2:
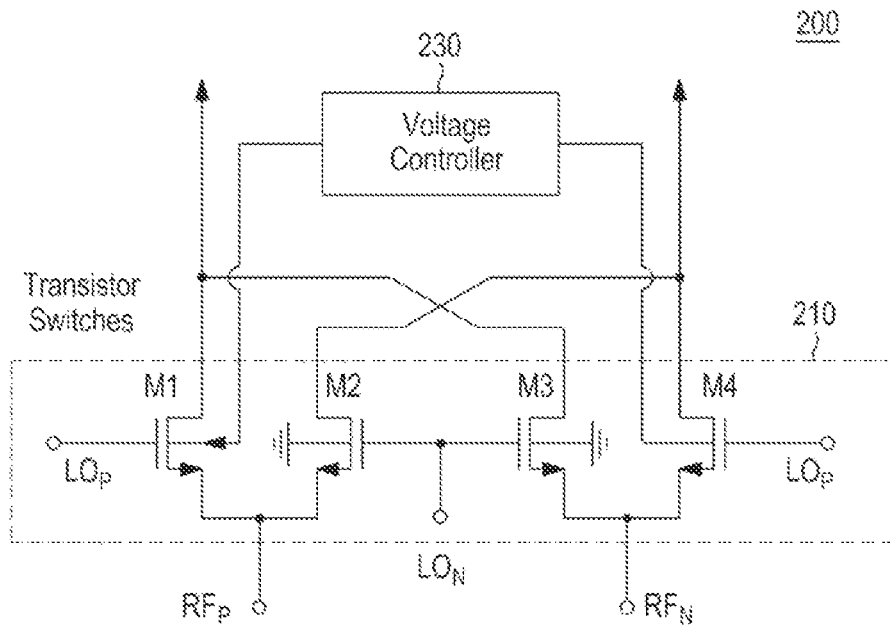
FIG. 2 is a circuit diagram illustrating a configuration of a mixer according to an exemplary embodiment of the present invention.

FIG. 2 is a circuit diagram illustrating a configuration of a mixer according to an exemplary embodiment of the present invention.

Referring to FIG. 2, a structure of a passive switching mixer, to which the IIP2 calibration method according to the present exemplary embodiments has been applied, is shown. A mixer 200 includes a switching unit 210 including a plurality of transistors M1 through M4, which may also be referred to as first through fourth transistors M1 through M4, and a voltage controller 230. The transistors M1 through M4 receive RF signals and Local Oscillation (LO) signals and output baseband signals. The voltage controller 230 outputs a voltage control signal for controlling the body voltage of at least one transistor, from among the transistors M1 through M4, to control the threshold voltage of the corresponding transistor. If the body voltage of the transistor is controlled by the voltage control signal, then the threshold voltage of the transistor may change, and accordingly, on-resistance may change when the transistor is turned on. As a result, artificial mismatch may be generated in the mixer 200.

The switching unit 210 is configured such that a LO signal $LO_P$ having a first phase is applied to gates of the first and fourth transistors M1 and M4, an RF signal $RF_P$ having the first phase is applied to a source of the first transistor M1, and an RF signal $RF_N$ having a second phase is applied to a source of the fourth transistor M4. Also, the switching unit 210 is configured such that a LO signal $LO_N$ having the second phase is applied to gates of the second and third transistors M2 and M3, the RF signal $RF_P$ having the first phase is applied to a source of the second transistor M2, and the RF signal $RF_N$ having the second phase is applied to a source of the third transistor M3. The first and second phases are 0 degree and 180 degrees, respectively, or vice versa, and thus the first and second phases have a phase difference of 180 degrees. Also, in the mixer 200 of FIG. 2, differential LO signals having a phase difference of 180 degrees are respectively applied to the gates of the corresponding transistors through an AC-coupling capacitor (not shown), thereby performing frequency conversion.

In the switching unit 210, a drain of the first transistor M1 is connected to a drain of the third transistor M3, and a drain of the fourth transistor M4 is connected to a drain of the second transistor M2. Also, according to another exemplary embodiment, bodies of the second and third transistors M2 and M3 may be grounded, and the bodies of the first and fourth transistors M1 and M4 may be connected to an output terminal of the voltage controller 230. However, the present invention is not limited to the circuit configuration of the switching unit 210 as illustrated in FIG. 2, and various circuit configurations are possible as long as the output terminal of the voltage controller 230 is connected to the body of at least one transistor.

In a case where IIP2 is degraded while the mixer 200 operates, for example, when a parameter value indicating IIP2 is smaller than a predetermined threshold value, then the voltage controller 230 of FIG. 2 receives a switching control signal represented as a bit stream from the controller of a receiver (not shown) that has detected the degradation of IIP2, then generates a voltage control signal for making the parameter value indicating the IIP2 equal to or greater than the predetermined threshold value, or in other words, for calibrating the IIP2, based on the switching control signal, and then outputs the voltage control signal to at least one transistor of the switching unit 210.

According to the present exemplary embodiment, the mixer 200 of FIG. 2 is implemented using an N-channel Metal Oxide Semiconductor (NMOS), however, the present invention is not limited thereto, and the mixer 200 may be implemented using other devices, such as a P-channel Metal Oxide Semiconductor (PMOS), MOSFETs, or other similar and/or suitable devices. That is, the transistors are not limited to NMOS type transistors. Also, the mixer 200 may have a double-balanced mixer structure or any other similar and/or suitable structure.

Accordingly, the mixer 200 may be, as illustrated in FIG. 2, implemented by connecting the voltage controller 230 to at least one transistor M1 or M4 to control the body voltage of the corresponding transistor M1 or M4 in a the double-balanced mixer structure. In a related-art mixer structure configured with NMOS transistors, the bodies of the NMOS transistors are all connected to a P-type substrate, which may be referred to as a ground GND. However, in the mixer 200 according to the present exemplary embodiment, the bodies of some transistors in the switching unit 210 are connected to tunable voltage nodes, which may be included in the voltage controller 230. Accordingly, the mixer 200 of FIG. 2 uses the body effect of mixer switches, such as the transistors M1 through M4, to be able to compensate for the threshold voltages or size mismatch of the mixer switches, thus influencing IIP2.

As such, artificially changing the body voltage of a transistor causes a mismatch in a threshold voltage $V_{TH}$ of the transistor. Hereinafter, a change in the threshold voltage $V_{TH}$ of a transistor by the body effect will be described using Equation (1) below.

$$V_{TH}=V_{THO}+\gamma(\sqrt{|2\Phi_F+V_{SB}|}-\sqrt{|\Phi_F|}), \quad \text{Equation (1)}$$

In Equation (1), $V_{THO}$ is the threshold voltage of the transistor when there is no body effect, that is, when no voltage control signal is applied to the body of the transistor, $V_{SB}$ is a voltage difference between the source and body of the transistor, $\Phi_F$ is a built-in voltage generated when p-type and n-type semiconductors are placed in contact, and $\gamma$ is a body effect coefficient that is generally a value of 0.3 to 0.4 $V^{1/2}$.

As seen in Equation (1), the threshold voltage $V_{TH}$ of the transistor increases in proportion to the voltage $V_{SB}$ between the source and body of the transistor by the body effect. Accordingly, since on-resistance increases according to an increase in the voltage $V_{SB}$ of the transistor when the transistor is driven in a turned-on state, an artificial mismatch in the transistor may be generated by adjusting the body voltage of the transistor. The mixer 200 generates the artificial mismatch by applying a body voltage to at least one transistor from among the plurality of transistors M1 through M4 constituting the switching unit 210, and cancels a mismatch of the mixer deteriorating IIP2 through the artificial mismatch.

Figure 3:
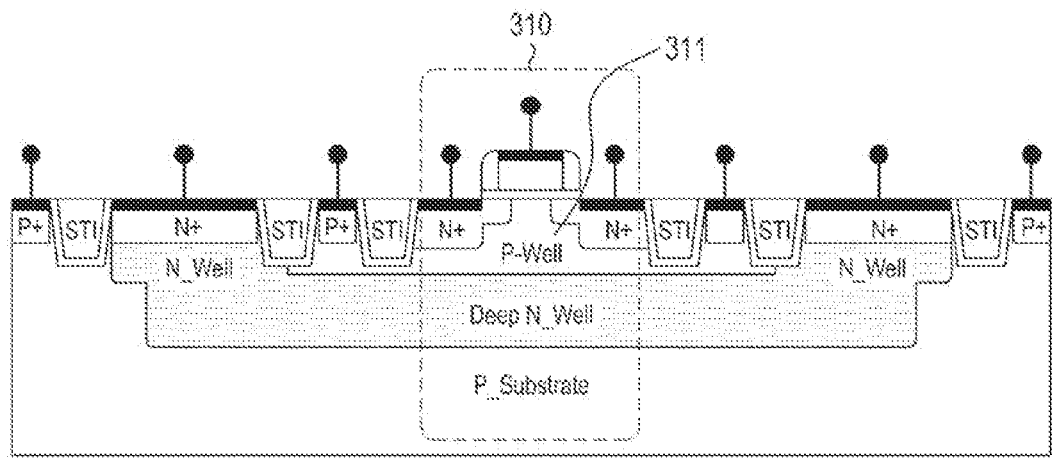
FIG. 3 is a view for explaining a transistor formed by a deep N-well Complementary Metal-Oxide Semiconductor (CMOS) process according to an exemplary embodiment of the present invention.

FIG. 3 is a view for explaining a transistor formed by a deep N-well CMOS process according to an exemplary embodiment of the present invention.

Referring to FIG. 3, in a case of a deep N-well CMOS process, the body of a CMOS is connected to a P-type substrate throughout the entire area, and the bodies of all NMOS transistors are connected to the ground. However, in the case of a deep N-well CMOS process or a triple-well CMOS process having excellent RF characteristics, as shown in FIG. 3, since each NMOS transistor 310 (see FIG. 3) in the CMOS has an independent P-well 311, it is possible to apply different body voltages to the individual NMOS transistors. Accordingly, the transistors M1 through M4 included in the mixer 200 of FIG. 2 may be transistors implemented by the deep N-well CMOS process or the triple-well CMOS process.

Accordingly, by using transistors implemented by the deep N-well CMOS process or the triple-well CMOS process, as shown in FIG. 3, a voltage control signal may be selectively applied to the body of at least one transistor in the mixer 200, thereby generating a different body voltage in the corresponding transistor. In order to maintain a P-N junction between a deep N-well and a P-well in a reverse-biased state, the voltage control signal $V_B$, which is a body voltage, that is applied to the body of the transistor should satisfy $V_B < V_S$, wherein $V_S$ is a source voltage.

Figure 4:
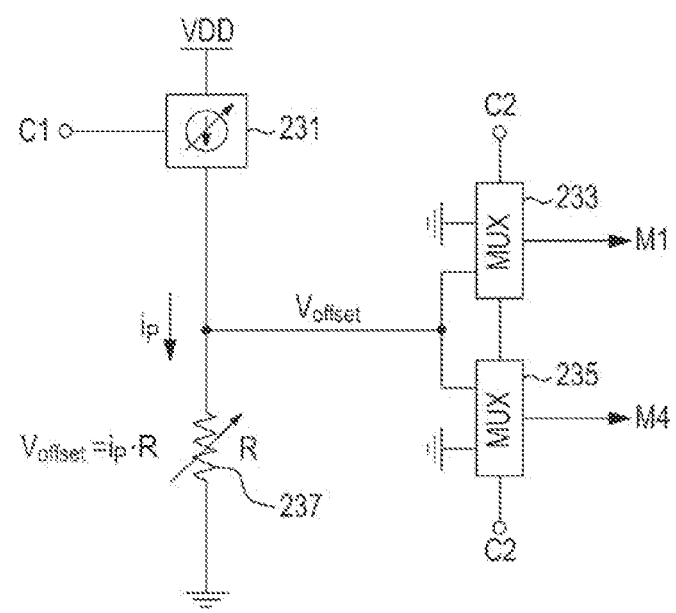
FIG. 4 is a circuit diagram illustrating a voltage controller for outputting a voltage control signal in a mixer, such as the mixer illustrated in FIG. 2, according to an exemplary embodiment of the present invention.

FIG. 4 is a circuit diagram illustrating the voltage controller for outputting a voltage control signal in a mixer, such as the mixer illustrated in FIG. 2, according to an exemplary embodiment of the present invention.

The voltage controller 230 of FIG. 4 may be an IIP2 calibration Digital-to-Analog Converter (DAC) that receives first and second switching control signals C1 and C2 which are digital signals from the controller of a receiver (not shown), and the voltage controller 230 may output a voltage control signal, which is an analog signal, to the bodies of the transistors M1 through M4 according to the first and second switching control signals C1 and C2. The voltage controller 230 of FIG. 4 may be implemented to include a variable current mirror 231, first and second switches, which may also be referred to as a Multiplexers (MUXs) 233 and 235, and a variable resistor 237.

If a parameter value indicating IIP2 is smaller than a predetermined threshold value, then the controller of the receiver outputs first and second switching control signals C1 and C2 represented as bit streams to the voltage controller 230. Then, the variable current mirror 231 adjusts an amount of a DC current $i_p$ to be mirrored according to the first switching control signal C1. At this time, a body voltage, which is a voltage control signal, $V_{offset}$ that is applied to the first or fourth transistor M1 or M4 (see FIG. 2) is according to the product of the current $i_p$, which is adjusted by the current mirror of the variable current mirror 231, and resistance R of the variable resistor 237, or in other words, $V_{offset} = i_p \times R$.

The voltage control signal $V_{offset}$ is selectively applied to the first or fourth transistor M1 or M4 according to the second switching control signal C2 output from the controller of the receiver that has detected a degree of mismatch, for example, a parameter value indicating IIP2, of the mixer 200. For this, the first and second switches 233 and 235 are configured such that if the first switch 233 is turned on according to the second switching control signal C2, then the second switch 235 is turned off, or, alternatively, such that if the first switch 233 is turned off according to the second switching control signal C2, then the second switch 235 is turned on. Here, the first and second switches 233 and 235 may be implemented as MUXs using the second switching control signal C2. Accordingly, the body voltage $V_{offset}$ may be selectively applied to the first or fourth transistor M1 or M4 according to the first and second switching control signals C1 and C2.

Operations of a receiver (not shown) which includes the mixer with the structure described above for calibrating IIP2 will be described below. A controller (not shown) of the receiver monitors whether a parameter value indicating IIP2 is smaller than a predetermined threshold value to determine whether IIP2 calibration is needed. If the controller determines that the parameter value is smaller than the predetermined value, then the controller generates switching control signals C1 and C2 for controlling the body voltage of at least one transistor from among the plurality of transistors. Then, the voltage controller 230 of the mixer outputs a voltage control signal $V_{offset}$ that is applied to the body of the at least one transistor according to the switching control signals C1 and C2 to control the body voltage of the transistor, thereby calibrating IIP2.

Figure 5:
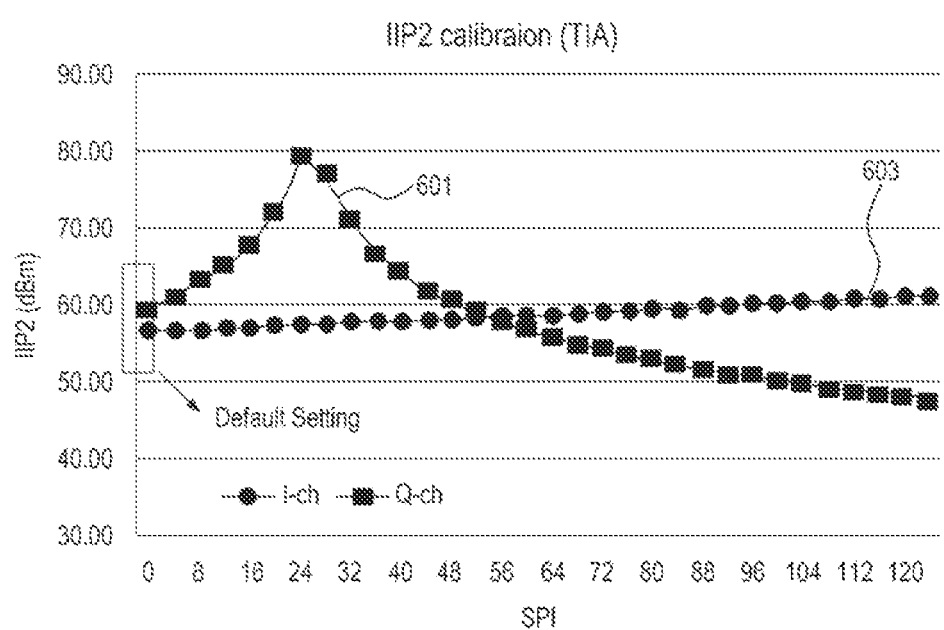
FIG. 5 is a graph showing performance simulation results of a mixer, such as the mixer illustrated in FIG. 2, according to an exemplary embodiment of the present invention.

FIG. 5 is a graph showing performance simulation results of a mixer, such as the mixer illustrated in FIG. 2, according to an exemplary embodiment of the present invention.

Referring to FIG. 5, the performance simulation, the performance of IIP2 calibration was verified under an assumption that there is mismatch of ±10% in a quadratic mixer switch, including I and Q paths, with the structure illustrated in FIGS. 2 and 4. In the performance simulation of the present exemplary embodiment, it is assumed that a body voltage that is controlled with one Least Significant Bit (LSB) is about 3 mV according to basic settings of the voltage controller 230 (see FIG. 2) that is controlled with 8 bits. The one LSB is a minimum unit that is controlled by a digital circuit. A one LSB body voltage and a range of IIP2 calibration may be adjusted by the variable resistor 237 (see FIG. 4). In the simulation, IIP2 was determined by measuring second-order output IM from an output of a Trans-Impedance Amplifier (TIA) after applying a two-tone signal to an input terminal of the mixer of an RX chain.

FIG. 5 shows the changed amounts of IIP2 values of I and Q channels after changing the 8-bit DAC code value of the Q channel. It can be seen from FIG. 5 that the IIP2 of the Q channel was improved from a default setting of 60 dBm to about 80 dBm. That is, FIG. 5 shows that the size mismatch (±10%) of the mixer, which is artificially applied according to the present exemplary embodiment, was significantly compensated for when the DAC code=24.

Consequently, as seen from the simulation result of FIG. 5, the IIP2 calibration method using the body effect of transistors, according to the present exemplary embodiment, may effectively compensate for the threshold voltage or the size mismatch of a mixer switch, thereby making it possible to improve IIP2. The IIP2 calibration method may be applied to an active mixer as well as the passive mixer described above.

The IIP2 of the mixer terminal is an important factor for determining reception sensitivity deterioration due to TX jammer. The mixer structure to which the IIP2 calibration method is applied may effectively improve IIP2 without deteriorating the performance of other parameters. Also, the present exemplary embodiments may compensate for components by coupling different leakage signals between RF and LO inputs, and by coupling components according to the LO path or mismatch of LO AC-coupling, as well as by coupling components according to the size of a mixer or mismatch in the threshold voltage.

The mixer structure for adjusting the body voltage, according to the exemplary embodiments of the present invention, has an advantage that it has lower sensitivity than a related-art mixer structure in which an offset voltage is applied to a gate voltage. Accordingly, the mixer may set a one-LSB resolution of a DAC, needed for IIP2 calibration, to a greater unit than the related-art mixer that changes a gate voltage. Accordingly, the number of bits of a control signal needed for IIP2 calibration may be reduces, thereby making it possible to simplify a design of an IIP2 calibration circuit and may reduce a total of a calibration time. Accordingly, it is possible to effectively reduce a test time of a wireless communication system and lower costs.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A mixer included in a receiver of a wireless communication system, the mixer comprising:

a switching unit including a plurality of transistors receiving a Radio Frequency (RF) signal and a Local Oscillation (LO) signal, and outputting a baseband signal; and a voltage controller outputting a voltage control signal controlling a body voltage of at least one transistor from among the plurality of transistors to thereby control a threshold voltage of the at least one transistor.

2. The mixer of claim 1, wherein, except for the at least one transistor from among the plurality of transistors, bodies of the plurality of transistors are grounded.

3. The mixer of claim 1, wherein, if the switching unit receives a switching control signal for calibrating a second-order Input Intercept Point (IIP2), then the voltage controller outputs the voltage control signal to the at least one transistor.

4. The mixer of claim 3, wherein the voltage controller outputs the voltage control signal to the body of the at least one transistor according to the received switching control signal if a value indicating the IIP2 is smaller than a predetermined threshold value.

5. The mixer of claim 1, wherein the at least one transistor includes first and second transistors whose bodies are respectively connected to the output terminal of the voltage controller, and wherein the voltage controller selectively outputs the voltage control signal to one of the first and second transistors.

6. The mixer of claim 1, wherein the mixer has a doubled-balanced mixer structure in which the voltage control signal is selectively applied to the body of the at least one transistor.

7. A receiver of a wireless communication system, the receiver comprising:

a mixer for frequency synthesis; and a controller for outputting a switching control signal for calibrating a second-order Input Intercept Point (IIP2) of the mixer, wherein the mixer comprises:

a switching unit including a plurality of transistors receiving a Radio Frequency (RF) signal and a Local Oscillation (LO) signal, and outputting a baseband signal; and a voltage controller outputting a voltage control signal controlling a body voltage of at least one transistor from among the plurality of transistors according to the switching control signal to thereby control a threshold voltage of the at least one transistor.

8. The receiver of claim 7, wherein, except for the at least one transistor from among the plurality of transistors, bodies of the plurality of transistors are grounded.

9. The receiver of claim 7, wherein the voltage controller outputs the voltage control signal to the body of the at least one transistor according to the switching control signal received from the controller if a value indicating the IIP2 is smaller than a predetermined threshold value.

10. The receiver of claim 7, wherein the at least one transistor includes first and second transistors whose bodies are respectively connected to the output terminal of the voltage controller, and wherein the voltage controller selectively outputs the voltage control signal to one of the first and second transistors.

11. The receiver of claim 7, wherein the mixer has a doubled-balanced mixer structure in which the voltage control signal is selectively applied to the body of the at least one transistor.

12. The receiver of claim 7, wherein the plurality of transistors are implemented according to a deep N-well CMOS process or a triple-well CMOS process.

13. A second-order Input Intercept Point (IIP2) calibration method of a mixer including a plurality of transistors in a wireless communication system, the IIP2 method comprising:

determining whether a parameter value indicating the IIP2 is smaller than a predetermined threshold value;

generating a switching control signal controlling a body voltage of at least one transistor from among the plurality of transistors if the parameter value is smaller than the predetermined threshold value; and outputting a voltage control signal that is applied to the body of the at least one transistor according to the switching control signal.

14. The IIP2 calibration method of claim 13, wherein, except for the at least one transistor from among the plurality of transistors, bodies of the plurality of transistors are grounded.

15. The IIP2 calibration method of claim 13, wherein the voltage control signal is selectively applied to the body of the at least one transistor.

16. The IIP2 calibration method of claim 13, wherein the mixer has a doubled-balanced mixer structure in which the voltage control signal is selectively applied to the body of the at least one transistor.

17. The IIP2 calibration method of claim 13, wherein the plurality of transistors are implemented according to a deep N-well CMOS process or a triple-well CMOS process.

18. The mixer of claim 1, wherein the voltage control signal is applied to a body of each of the least one transistor.

19. The receiver of claim 7, wherein the voltage control signal is applied to a body of each of the least one transistor.

20. The IIP2 calibration method of claim 13, wherein the voltage control signal is applied to a body of each of the least one transistor.

* * * * *